United States Patent [19]

Lee et al.

[11] Patent Number: 5,663,913

[45] Date of Patent: Sep. 2, 1997

[54] SEMICONDUCTOR MEMORY DEVICE HAVING HIGH SPEED PARALLEL TRANSMISSION LINE OPERATION AND A METHOD FOR FORMING PARALLEL TRANSMISSION LINES

[75] Inventors: Ho-Cheol Lee; Hyun-Soon Jang, both of Seoul, Rep. of Korea

[73] Assignee: Samsung Electronics Co., Ltd., Suwon, Rep. of Korea

[21] Appl. No.: 638,373

[22] Filed: Apr. 26, 1996

[30] Foreign Application Priority Data

Apr. 27, 1995 [KR] Rep. of Korea ............... 10170/1995

[51] Int. Cl.[6] .................................................. G11C 7/00
[52] U.S. Cl. ............................................. 365/194; 365/198
[58] Field of Search ................................. 365/194, 198, 365/233; 333/260

[56] References Cited

U.S. PATENT DOCUMENTS 3,453,607  7/1969  Cohler et al. ........................ 365/198
3,585,399  6/1971  Andrews, Jr. ........................ 365/198
5,239,215  8/1993  Yamaguchi ........................... 327/292
5,304,969  4/1994  Jacobowitz et al. .................. 333/260

*Primary Examiner*—David C. Nelms
*Assistant Examiner*—Trong Quang Phan
*Attorney, Agent, or Firm*—Cushman Darby & Cushman, IP Group of Pillsbury Madison & Sutro LLP

[57] ABSTRACT

A semiconductor memory device has the skew between the individual transmission lines of a parallel transmission bus minimized by the addition of respective load transmission lines to each of the individual transmission lines in the parallel bus. A first circuit unit including a first parallel bank of internal circuits for generating internal control signals is formed adjacent to a predetermined region within a chip. A second circuit unit includes a second parallel bank of internal circuits for performing a predetermined operation in response to an output of the first circuit unit. The second circuit transmits signals to the first circuit over a parallel bus comprised of a plurality of transmission lines connected respectively between the individual internal circuits of the first and second circuit units. A plurality of load transmission lines are connected respectively to predetermined portions of the individual transmission lines to thereby equalize the loads of the transmission lines.

8 Claims, 3 Drawing Sheets

SEMICONDUCTOR MEMORY DEVICE HAVING HIGH SPEED PARALLEL TRANSMISSION LINE OPERATION AND A METHOD FOR FORMING PARALLEL TRANSMISSION LINES

BACKGROUND OF THE INVENTION

The present invention is based on Korean Patent Application No. 10170/1995 filed on Apr. 27, 1995, which is explicitly incorporated herein by reference.

1. Field of the Invention

The present invention relates to semiconductor memory devices, and more particularly to the formation of transmission lines in parallel buses within semiconductor memory devices which results in reduced skew between the signals transmitted on the various lines of the parallel bus. The reduced skew enables higher speed operation than would otherwise be possible.

2. Description of the Related Art

The speed of operation is very important in semiconductor memory devices, particularly when combined with other advantageous features such as high integration and low power consumption. However, skew is often a limiting factor in the limit to which speed can be increased. Skew occurs between the various lines of a parallel data bus in large part because of the difference in length and other characteristics between each individual transmission line within the semiconductor device. It is very desirable to reduce the skew so that the bandwidth of the semiconductor device is increased. However, since it is impossible in practice to place all internal circuits comprised in the semiconductor memory device in locations which would make all transmission lines of a parallel bus equal in length, width and other characteristics, mostly due to the limited chip size and desire to provide higher integration in semiconductor memory devices, it is very difficult in practice to reduce the skew beyond certain conventional levels.

FIG. 1 is a diagram showing a conventional arrangement of representative internal circuits connected to a parallel bus in a semiconductor memory device. The configuration and operation of the conventional semiconductor memory device will now be described with reference to FIG. 1.

In systems using parallel buses, e.g., microprocessor-based systems, various parallel control signals are input into a semiconductor memory device through pads (not shown) so as to drive storage elements, e.g., memory. In the conventional device as shown in FIG. 1, external parallel control signals are input into the semiconductor memory device through the pads. These parallel control signals are then typically buffered by passing them through a parallel bank of buffers within the chip, and then become internal parallel control signals IN1 to IN8 as shown in FIG. 1. The internal parallel control signals IN1 to IN8 are applied to a first parallel bank of internal circuits 12a–12h forming a first circuit unit. The signals output from the first parallel bank of internal circuits 12a–12h are then transmitted over a parallel bus formed of individual transmission lines 16a–16h, and received by a second parallel bank of internal circuits 14a–14h comprised in a first circuit unit, which then outputs respective parallel output signals OUT1 to OUT8.

The sensing signal S1 is transmitted on line 20 to enable the second parallel bank of internal circuits 14a to 14h comprised in the second circuit unit. The use of sensing signals is well known in the art and thus only a brief description is given herein.

FIG. 2 is an operational timing diagram of FIG. 1. As can be seen from FIG. 2, a time lag t1 occurs between the output of the fastest one of the parallel output signals OUT1 to OUT8 and the slowest one of the parallel output signals OUT1 to OUT8. This is due to a skew in the arrival time of the individual lines of the parallel control signals. Thus, the transmission time of signals on the individual transmission lines 16a–16h is not identical but rather varies between the respective first parallel bank of internal circuits 12a to 12h and the second parallel bank of internal circuits 14a to 14h. This time interval makes the respective output times from the second parallel bank of internal circuits 14a to 14h different from one another, thereby causing a time interval between the output signals OUT1 to OUT8. It will be understood and appreciated by those skilled in the art that the longer this time interval due to skew between the individual transmission lines 16a to 16h, the slower the device becomes because the device is only as fast as the slowest transmission line 16a to 16h. Thus, the skew makes high speed operation difficult.

Another conventional technique for reducing skew is to vary the size of internal driving circuits such that skew is reduced. However, this technique proves to be a complicated solution to reduce skew.

SUMMARY OF THE INVENTION

It is therefore an object of the present invention to provide a semiconductor memory device which can operate at high speed by minimizing the skew between parallel input signals.

It is another object of the present invention to provide a method for forming transmission lines in a semiconductor memory device which can operate at high speed by minimizing the skew between parallel input signals.

It is a further object of the present invention to reduce skew in a semiconductor memory device by simply adding load transmission lines which impedance match a corresponding plurality of parallel transmission lines.

To achieve the above objects, a semiconductor memory device of the present invention has a first circuit unit including a first parallel bank of a plurality of internal circuits for generating internal control signals formed adjacent to a predetermined region within a chip. A second circuit unit includes a second parallel bank of a plurality of internal circuits which perform a predetermined operation in response to an output of the first circuit unit. A parallel bus comprises a plurality of transmission lines connected respectively between the individual internal circuits of the first and second circuit units. Most importantly, the parallel bus includes a plurality of load transmission lines connected respectively to predetermined portions of each of the plurality of transmission lines. The plurality of load transmission lines equalize the loads of the respective transmission lines of the parallel bus and thus minimize the skew caused by the real-world differences between the transmission lines in a parallel bus.

It is also an object of the present invention to provide a method for forming transmission lines in a semiconductor memory device. The method includes a step of additionally connecting different sizes (i.e. lengths) of load transmission lines respectively to the transmission lines connected between the internal circuits of the first and second parallel banks of internal circuit units to thereby equalize the loads of the transmission lines of a parallel bus and minimize the skew therebetween.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENTS

Figure 1:
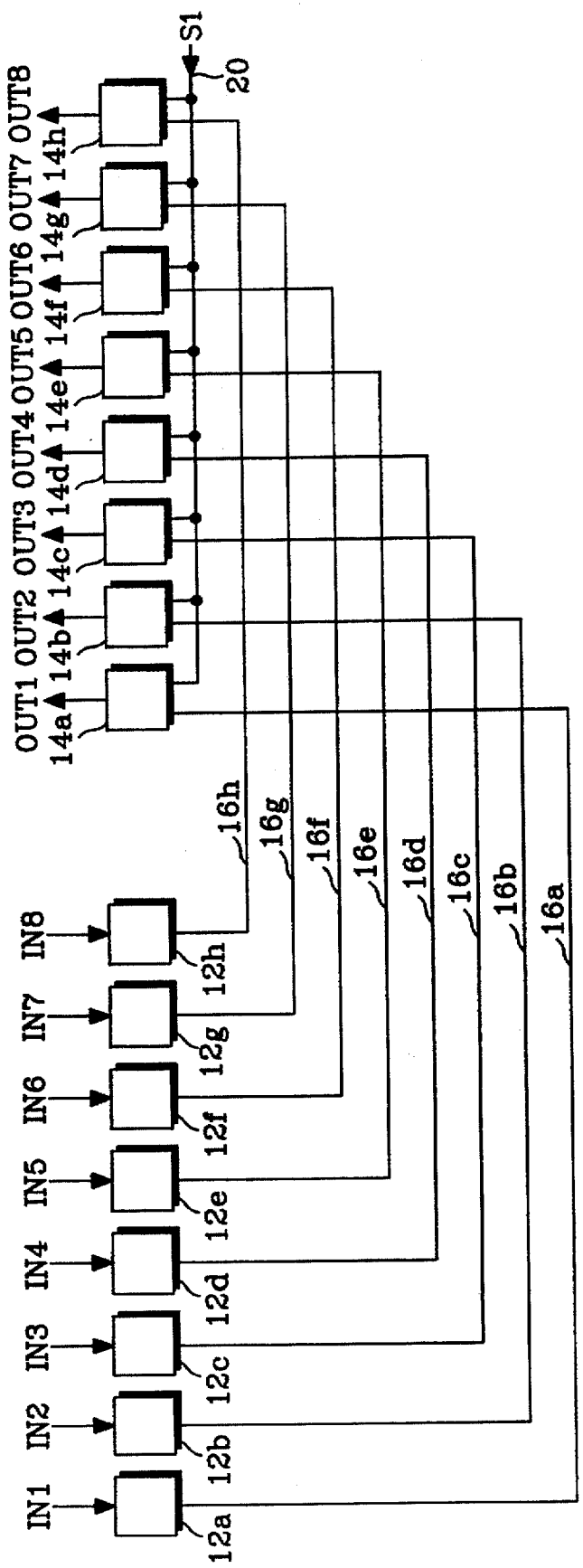
FIG. 1 is a circuit diagram showing a conventional semiconductor memory device including parallel transmission lines.

A preferred embodiment of a semiconductor memory device according to the present invention will now be described in detail with reference to the accompanying drawings. It should be noted that the same parts or elements shown in the drawings are represented by the same reference number or symbol wherever possible.

Figure 3:
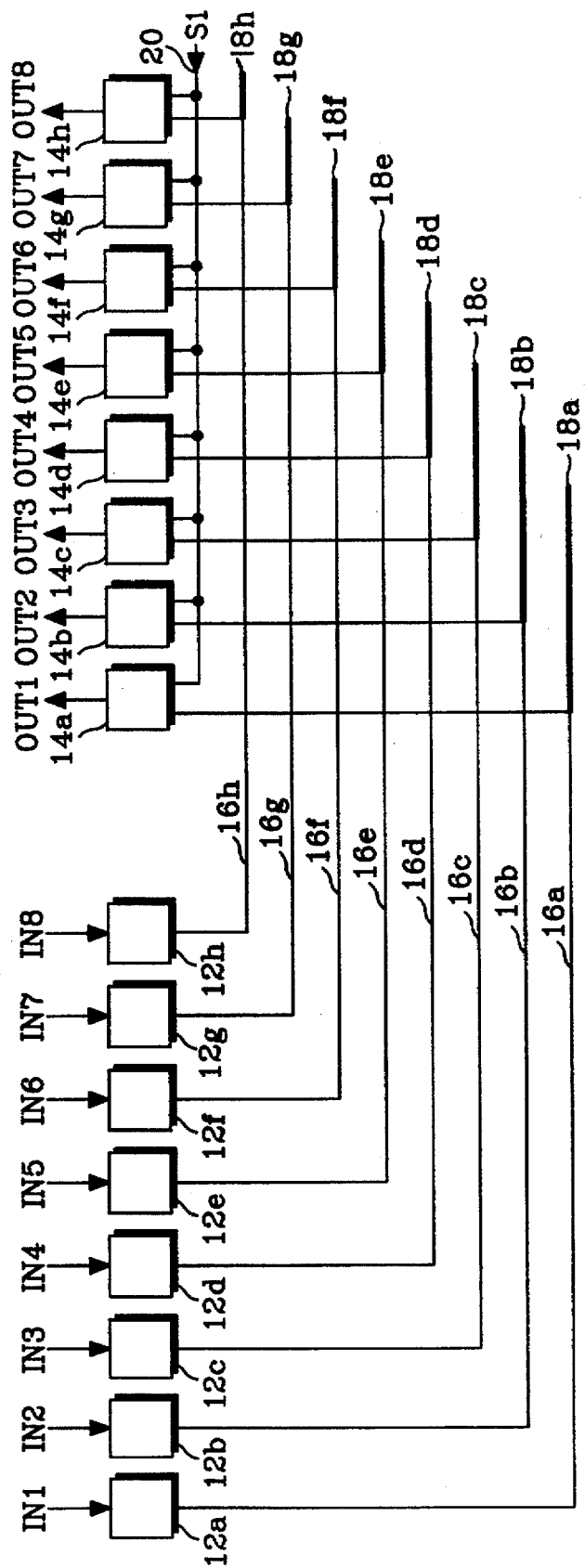
FIG. 3 is a circuit diagram showing a semiconductor memory device according to a preferred embodiment of the present invention.

FIG. 3 is a circuit diagram showing a semiconductor memory device according to a preferred embodiment of the present invention. FIG. 3 has the same configuration as FIG. 1 except for the addition of load transmission lines 18a to 18h connected to predetermined portions of transmission lines 16a to 16h. The load transmission lines 18a to 18h are formed, in one embodiment, at the same time as the transmission lines 16a to 16h, and are found to equalize the skew between the individual transmission lines 16a to 16h and thus allow the memory device to operate at higher speeds than were otherwise possible. The load transmission lines 18a to 18h can be straight, curved or looped and can have a width, depth and length as determined by conventional simulation techniques.

Figure 2:
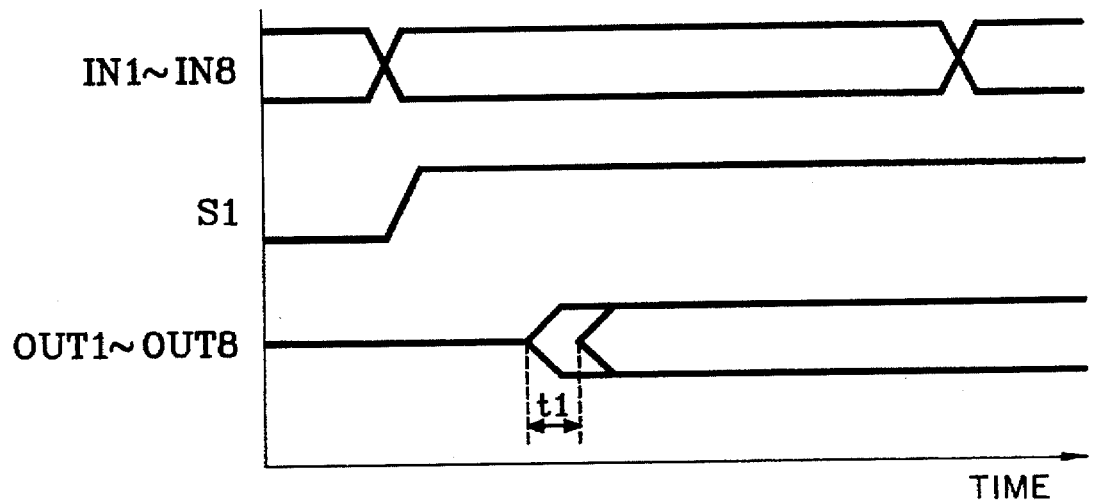
FIG. 2 is an operational timing diagram of the conventional semiconductor memory device shown in FIG. 1.
Figure 4:
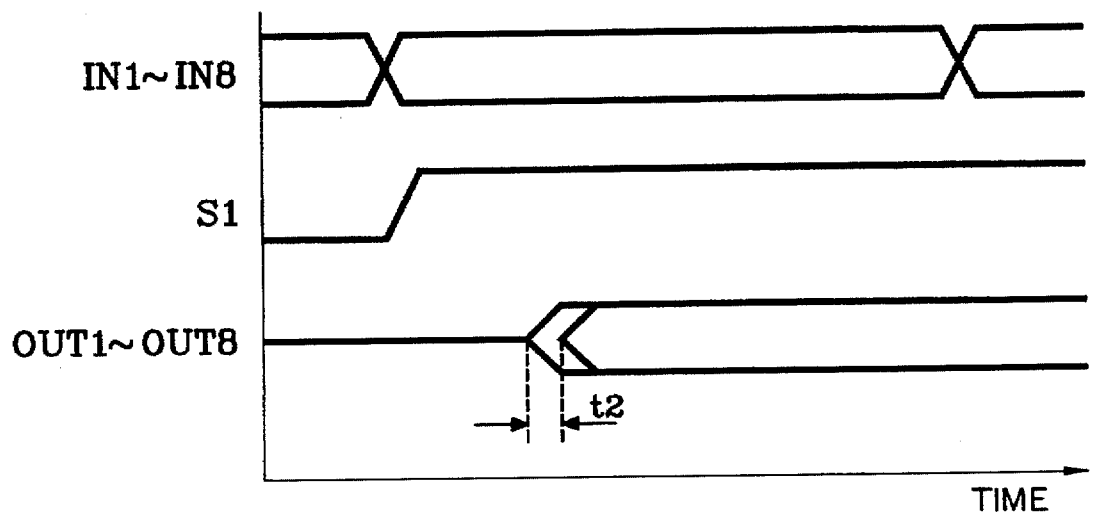
FIG. 4 is an operational timing diagram of the preferred embodiment of the present invention shown in FIG. 3.

FIG. 4 is an operational timing diagram of the circuit shown in FIG. 3. As can be seen from FIG. 4, the transmission time for signals travelling from the first parallel bank of internal circuits 12a to 12h comprised in the first circuit unit to the second parallel bank of internal circuits 14a to 14h comprised in the second circuit unit are made to be more similar as between the individual transmission lines. Thus, the skew t2 between the individual transmission lines in a parallel bus according to the present invention is made significantly shorter in duration than the skew t1 of the conventional transmission lines in the conventional parallel bus (e.g., as shown in FIG. 2). This enables the output signals OUT1–OUT8 to be closely timed and even identical.

This is possible because even though the loads of the transmission lines 16a to 16h are different from one another due to the real-world differences in the formation of parallel transmission lines, the load transmission lines 18a to 18h connected to predetermined portions of the transmission lines 16a to 16h equalize the loads of the transmission lines 16a to 16h so as to minimize the load difference therebetween. Thereby, the skew, i.e., the time delay due to the time interval between the transmission signals, can be minimized. As shown in FIG. 4, the skew t2 of the transmission lines of the present invention is remarkably reduced as compared with the skew t1 of the conventional device shown in FIG. 2.

With the transmission lines and load transmission lines formed according to the present invention, a high bandwidth device is possible, thereby enabling high frequency operation. In addition, it is possible to reduce the overall timing of the memory device and thus to design higher speed devices.

It will be understood by those skilled in the art that the first and second circuit units used in the preferred embodiment of the present invention are not limited to any specific circuit but are applicable to various circuits comprised in the semiconductor memory device.

While the preferred embodiment has been illustrated and described, it is to be understood by those skilled in the art that various changes and modifications may be made without departing from the spirit and scope of the present invention. Therefore, it is intended that the present invention not be limited to only the particular embodiments disclosed, but rather that the present invention include all embodiments falling within the scope of the appended claims.

What is claimed is:

1. A semiconductor memory device, comprising:

a first circuit unit including a plurality of first internal circuits for generating internal control signals formed adjacent to a predetermined region within a chip of said semiconductor memory device;

a second circuit unit including a plurality of second internal circuits formed within said chip for performing a predetermined operation in response to an output of said first circuit unit;

a plurality of transmission lines formed within said chip respectively connected between said plurality of first internal circuits in said first circuit unit and said plurality of second internal circuits in said second circuit unit; and a plurality of load transmission lines formed within said chip connected respectively to a predetermined portion of each of said plurality of transmission lines, said plurality of load transmission lines equalizing loads of said plurality of transmission lines so as to minimize skew therebetween.

2. A semiconductor memory device according to claim 1, wherein:

each of said plurality of transmission lines have a length different from one another.

3. A semiconductor memory device according to claim 1, wherein:

said predetermined portions of said plurality of transmission lines to which said plurality of load transmission lines are connected are adjacent to said second circuit unit.

4. A semiconductor memory device, comprising:

a first circuit unit including a plurality of first internal circuits for generating internal control signals formed adjacent to a predetermined region within a chip of said semiconductor memory device;

a second circuit unit including a plurality of second internal circuits formed within said chip for performing a predetermined operation in response to an output of said first circuit unit;

parallel bus means, including a plurality of transmission lines formed within said chip and connected respectively between said plurality of first internal circuits in said first circuit unit and said plurality of second internal circuits in said second circuit unit, for transmitting signals from said first circuit unit to said second circuit unit; and impedance matching means, including a plurality of load transmission lines formed within said chip and connected respectively to a predetermined portion of each of said plurality of transmission lines of said parallel bus means, said impedance matching means matching respective impedances of each of said plurality of transmission lines to minimize skew between signals transmitted on said plurality of transmission lines.

5. A semiconductor memory device according to claim 4, wherein:

each of said plurality of transmission lines of said parallel bus means have a length different from one another.

6. A semiconductor memory device according to claim 4, wherein:

said predetermined portions of said plurality of transmission lines to which said plurality of load transmission lines are connected are adjacent to said second circuit unit.

7. A method of forming a plurality of plurality functioning transmission lines within a chip of a semiconductor memory device to have skew between signals transmitted thereby reduced, said plurality of parallel functioning transmission lines having different respective lengths as between a first parallel bank of internal circuits formed within said chip and a second parallel bank of internal circuits formed within said chip said method comprising the steps of:

forming said plurality of plurality functioning transmission lines within said chip between said first parallel bank of internal circuits and said second parallel bank of internal circuits; and forming a plurality of load transmission lines within said chip and connected respectively to said plurality of parallel functioning transmission lines, each of said plurality of load transmission lines having a different size such that said plurality of load transmission lines equalize loads of said plurality of parallel functioning transmission lines.

8. A method according to claim 7, wherein:

said plurality of load transmission lines minimize a load difference between said plurality of transmission signals transmitted on said plurality of parallel functioning transmission lines.

\* \* \* \* \*